United States Patent
Hu et al.

(10) Patent No.: US 11,435,792 B2
(45) Date of Patent: Sep. 6, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Quan Hu, Hubei (CN); Songshan Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 181 days.

(21) Appl. No.: 16/964,208

(22) PCT Filed: Jan. 9, 2020

(86) PCT No.: PCT/CN2020/071042
§ 371 (c)(1),
(2) Date: Jul. 23, 2020

(87) PCT Pub. No.: WO2021/022786
PCT Pub. Date: Feb. 11, 2021

(65) Prior Publication Data
US 2021/0096615 A1    Apr. 1, 2021

(30) Foreign Application Priority Data

Aug. 2, 2019  (CN) .......................... 201910710037.6

(51) Int. Cl.
*G06F 1/18*    (2006.01)
*G09G 3/3208*  (2016.01)

(52) U.S. Cl.
CPC .......... *G06F 1/189* (2013.01); *G09G 3/3208* (2013.01); *G09G 2300/0426* (2013.01)

(58) Field of Classification Search
CPC ......... G06F 1/189; G09F 9/33; G09G 3/3225; G09G 2300/0426; G09G 3/3208; H01L 27/3246; H01L 27/3276
See application file for complete search history.

(56) References Cited

U.S. PATENT DOCUMENTS

2005/0127376 A1\* 6/2005 Young ................. H01L 27/3276
257/432
2007/0114530 A1\* 5/2007 Kimura .............. H01L 27/3276
257/E27.131
(Continued)

FOREIGN PATENT DOCUMENTS

CN    103296058 A    9/2013
CN    104701352 A    6/2015
(Continued)

*Primary Examiner* — Stacy Khoo
(74) *Attorney, Agent, or Firm* — Mark M. Friedman (57) ABSTRACT

A display panel and a display device are provided. The display panel has a display area and a fan-out area. The fan-out area and the display area at least partially overlap. By arranging at least one part of the fan-out area in the display area, the display area of the display panel expends to the fan-out area, and therefore the area of the display area of the display panel is increased to reduce the area of the non-display area occupied by the fan-out area. That is, the problem that the non-display area of the display panel is too large is alleviated and the narrow border and full screen technology are further implemented.

18 Claims, 3 Drawing Sheets

(56) References Cited

U.S. PATENT DOCUMENTS

| | | | |
|---|---|---|---|
| 2016/0163777 A1 | 6/2016 | Ozawa et al. | |
| 2016/0197127 A1* | 7/2016 | Park | H01L 27/3276 |
| | | | 438/34 |
| 2017/0092698 A1 | 3/2017 | Zou | |
| 2019/0131377 A1 | 5/2019 | Kwon et al. | |
| 2019/0348489 A1* | 11/2019 | Na | H01L 27/3276 |
| 2020/0251539 A1 | 8/2020 | Fu | |

FOREIGN PATENT DOCUMENTS

| | | |
|---|---|---|
| CN | 109728188 A | 5/2019 |
| CN | 109801950 A | 5/2019 |
| CN | 110085759 A | 8/2019 |
| CN | 110491915 A | 11/2019 |

* cited by examiner

DISPLAY PANEL AND DISPLAY DEVICE

FIELD OF INVENTION

This application claims priority from a Chinese patent application filed with the National Intellectual Property Administration, PRC (CNIPA) on Aug. 2, 2019, with application number 201910710037.6, and the invention name is "DISPLAY PANEL AND DISPLAY DEVICE", the entire contents of which are incorporated herein by reference.

The present disclosure relates to a display technical field, and specifically, to a display panel and a display device.

BACKGROUND OF INVENTION

With the gradual development of the display technology, full screens and narrow borders have become the mainstream in the display technology in the future.

In traditional panels, the non-display area occupies a large part of the area of the display panel due to the circuits design in the non-display area below the display area of the display panel. The area cannot display images and hinders the realization of the narrow border of the display device.

The current display panel has a problem that the non-display area is too large, and the problem needs to be solved.

SUMMARY OF DISCLOSURE

Technical Problem

The present disclosure provides a display panel and a display device for solving the problem that the area of the non-display area in the current display panel is too large.

Technical Solutions

The present disclosure provides a display panel, comprising:
a display area;
a fan-out area;
wherein the fan-out area and the display area at least partially overlap.

In the display panel of the present disclosure, the display panel further includes a driving circuit disposed within the display area that does not overlap with the fan-out area.

In the display panel of the present disclosure, the display panel includes a pixel definition layer defining a light-emitting area which at least partially overlaps with the fan-out area.

In the display panel of the present disclosure, the light-emitting area corresponding to at least one row of pixels is at least partially located within the fan-out area.

In the display panel of the present disclosure, the light-emitting area corresponding to the last row of pixels is at least partially located within the fan-out area.

In the display panel of the present disclosure, the light-emitting area corresponding to the last row of pixels is located within the fan-out area.

In the display panel of the present disclosure, the display panel further comprises a plurality of pixel electrodes which are at least partially located within the fan-out area.

In the display panel of the present disclosure, the pixel electrodes corresponding to at least one row of pixels are at least partially located within the fan-out area.

In the display panel of the present disclosure, the pixel electrodes corresponding to the last row of pixels are located within the fan-out area.

In the display panel of the present disclosure, the pixel electrodes corresponding to the last row of pixels comprise a first portion and a second portion, wherein the first portion is located within the fan-out area, and the second portion is located within the display area that does not overlap with the fan-out area.

In the display panel of the present disclosure, the pixel electrodes corresponding to the last row of the pixels are located within the fan-out area.

In the display panel of the present disclosure, the display panel further comprises a plurality of transition electrodes, and the last row of the transition electrodes connect with the last row of the pixel electrodes and a drain electrode corresponding to the last row of the pixels.

In the display panel of the present disclosure, the size of each of the last row of the transition electrodes is larger than the size of the drain electrode connecting thereto.

In the display panel of the present disclosure, the display panel is provided with other transition electrodes connecting to the pixel electrodes and the drain electrode corresponding to the other transition electrodes, respectively.

In the display panel of the present disclosure, the area of each of the last row of the transition electrodes is larger than the area of each of the other transition electrodes.

In the display panel of the present disclosure, the size of each of the other transition electrodes is equal to the size of the drain electrode connecting thereto.

In the display panel of the present disclosure, each of the other transition electrodes is located directly above the drain electrode connecting thereto.

In the display panel of the present disclosure, a material of the transition electrodes is the same as a material of the drain electrode.

In the display panel of the present disclosure, the display panel comprises conversion vias and conversion lines both located within the fan-out area, wherein the conversion lines and the drain electrode within the driving circuit are disposed on the same layer, and a part of the conversion lines connect to a gate driving circuit through the conversion vias.

Furthermore, the present disclosure provides a display device, comprising a display panel comprising a display area and a fan-out area, wherein the fan-out area and the display area at least partially overlap.

Beneficial Effects

The present disclosure provides a display panel and a display device. The display panel includes a display area and a fan-out area. The fan-out area and the display area at least partially overlap. By arranging at least one part of the fan-out area in the display area, the display area of the display panel expends to the fan-out area, and therefore the area of the display area of the display panel is increased to reduce the area of the non-display area that is occupied by the fan-out area. That is, the problem that the non-display area of the display panel is too large is alleviated, and the narrow border and full-screen technology are further implemented.

DETAILED DESCRIPTION OF PREFERRED EMBODIMENTS

For the problem that the conventional display panel has too large non-display area, the present disclosure provides a display panel to solve this problem.

Figure 1:
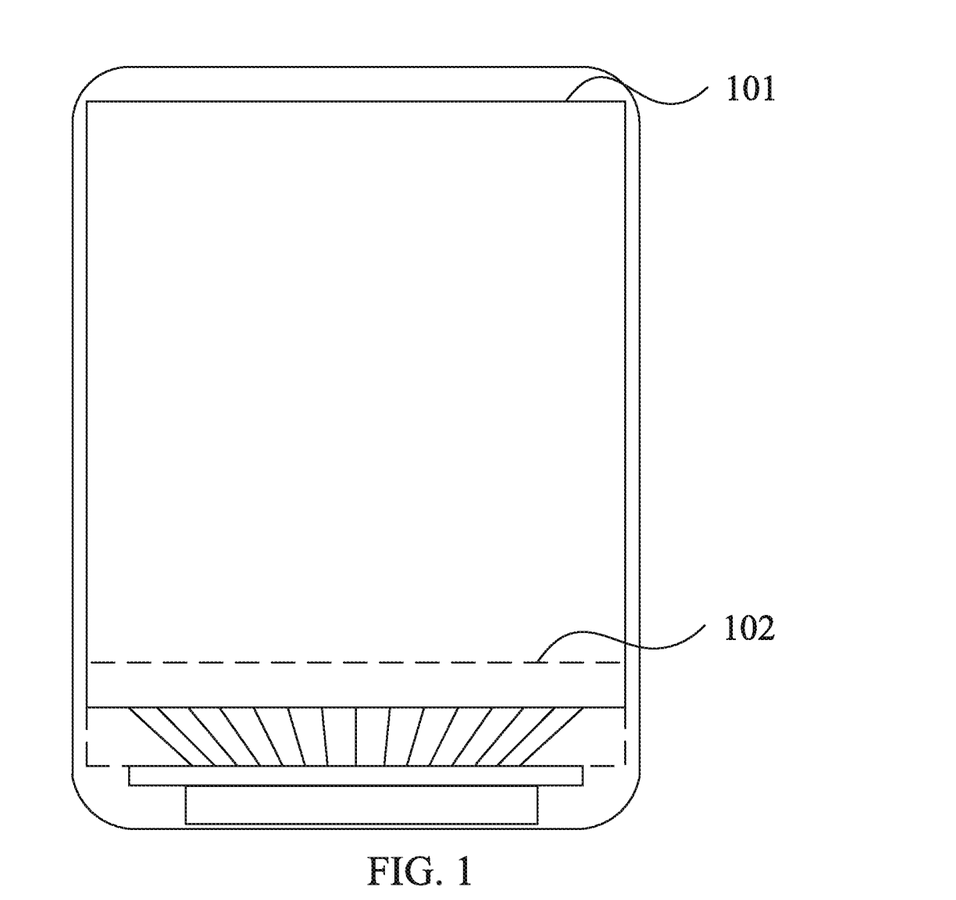
FIG. 1 is a top view of a display panel according to the present disclosure.

In one embodiment, as shown in FIG. 1, a display panel 10 according to the present disclosure includes:

a display area 101; and a fan-out area 102;

wherein the fan-out area 102 and the display area 101 at least partially overlap.

This embodiment provides a display panel, and the display area of the display panel expends to the fan-out area by arranging at least one part of the fan-out area in the display area, and therefore the area of the display area of the display panel is increased to reduce the area of the non-display area that is occupied by the fan-out area. That is, the problem that the non-display area of the display panel is too large is alleviated and the narrow border and full-screen technology are further implemented.

Figure 2:
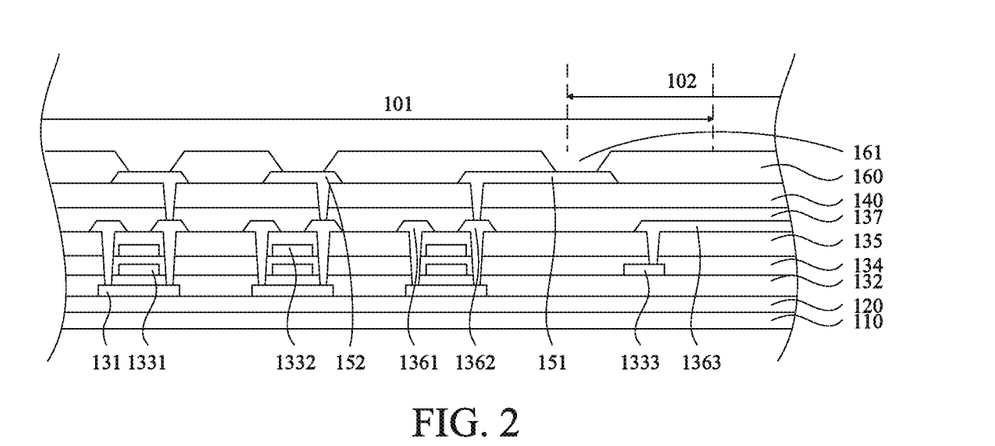
FIG. 2 is a schematic view showing a first structure of a display panel according to the embodiment of the present disclosure.
Figure 3:
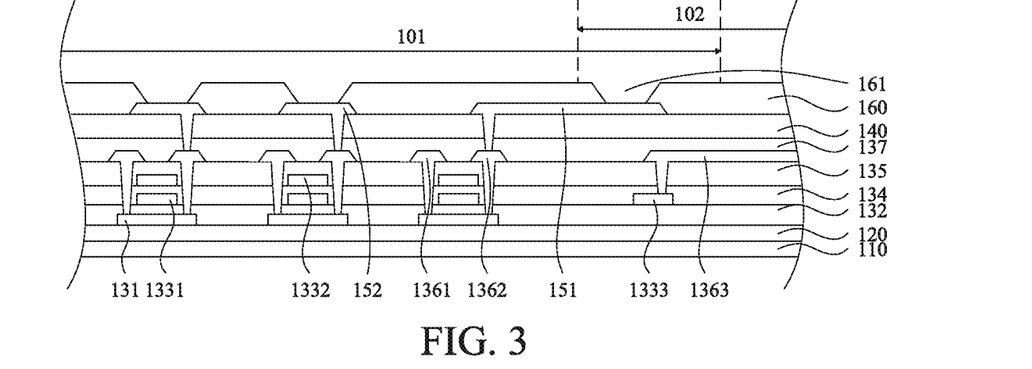
FIG. 3 is a schematic view showing a second structure of a display panel according to the embodiment of the present disclosure.

In one embodiment, the display panel 10 of the present disclosure is an organic light emitting diode (OLED) display panel as shown in FIG. 2 and FIG. 3. The OLED display panel 10 comprises following elements:

A substrate 110 comprises a glass substrate and a flexible substrate. The glass substrate is made of rigid glass materials and located at the bottom of the display panel. The flexible substrate is generally made of organic polymer materials, such as polyimide or polyethylene terephthalate, and formed on the glass substrate.

A buffer layer 120 is configured for blocking water and oxygen from entering the display panel 10 to avoid reducing the service life of the display panel, and to prevent impurities from diffusing into thin film transistors and avoid reducing leakage current. The buffer layer generally uses a stacking structure of silicon nitride ($SiN_x$) and silicon oxide ($SiO_x$). Silicon nitride has a strong ion barrier ability, and also a desirable water and oxygen isolation ability. The interface between silicon oxide and polysilicon has better wettability and would be better used as a base material for forming an active layer.

A thin film transistor layer 130 comprises: an active layer patterned to form an active area 131, wherein the active area 131 is doped to form a trench area and a doped area, and the active layer is generally made of amorphous silicon or polysilicon. Additionally, the thin film transistor comprises a first gate insulating layer 132 covering the buffer layer 120 and the active layer, wherein the material of the first gate insulating layer 132 is silicon oxide. The surface of silicon oxide and polysilicon have desired grain boundary matching, stress matching, and desired step coverage. The thin film transistor comprises a first gate layer formed on the first gate insulating layer 132 and then patterned to form a first gate electrode 1331 located within the display area that does not overlap the fan-out area and a gate lead 1333 located within the fan-out area 102. The material of the first gate layer is generally metal molybdenum (Mo). The thin film transistor comprises a second gate insulating layer 134 covering the first gate insulating layer 132 and the first gate layer. The material of the second insulating layer is silicon nitride. The thin film transistor comprises a second gate layer formed on the second gate insulating layer 134 and patterned to form a second gate electrode 1332. The material of the second gate layer is generally metal molybdenum (Mo). The thin film transistor comprises an interlayer insulating layer 135 covering the second gate insulating layer 134 and the second gate layer, wherein the interlayer insulating layer generally has a stacking structure of silicon nitride ($SiN_x$) and silicon oxide ($SiO_x$). A source-drain electrode layer 136 is formed on the interlayer insulating layer 135 and patterned to form a source electrode 1361 and a drain electrode 1362 located within the display area 101, and conversion lines 1363 located within the fan-out area 102. The source-drain electrode layer 136 is generally a stacking structure of metal titanium/aluminum/titanium (Ti/Al/Ti). A passivation layer 137 covers the interlayer insulating layer 135 and the source-drain electrode layer 136 and also plays a role in insulation. The material of the passivation layer is generally silicon nitride. In the display area without overlapping the fan-out area, the active layer, the first gate layer, the second gate layer, the source-drain electrode layer together form a driving circuit of the display panel. A part of the conversion lines 1363 connect the gate lead 1333 through conversion vias, thereby connecting a gate driving circuit.

A planarization layer 140 is formed on the passivation layer for planarizing the thin film transistor layer 130 to provide a flat substrate for the subsequent preparation of pixel electrodes. The material of the planarization layer is organics.

A pixel electrode layer is formed on the planarization layer 140 and then patterned to form pixel electrodes 150. The pixel electrodes 150 comprise the last row of the pixel electrodes 151 corresponding to the last pixels, and the pixel electrodes 152 corresponding to other rows of the pixels. As shown in FIG. 2 and FIG. 3, the last row of the pixel electrodes 151 extends toward the fan-out area 102. The size of the last row of the pixel electrodes 151 is larger than the size of the other rows of the pixel electrodes 152. The pixel electrodes 150 connect the drain electrode through vias within the planarization layer 140 and the passivation layer 137.

A pixel definition layer 160 is formed on the planarization layer 140 and the pixel electrode layer, and then patterned to form a light-emitting area 161 for defining a pixel area.

There are also a material layer formed within the light-emitting area 161, and support columns, a common electrode layer, and an encapsulation layer formed on the pixel definition layer (not shown).

The OLED display panel of this embodiment may have a top-gate structure as shown in FIG. 1, or a bottom-gate structure; a double-gate structure as shown in FIG. 3 and a single-gate structure are also available. The pixel electrode may connect the drain electrode or connect the source electrode, and they are not limited thereto.

In one embodiment, the light-emitting area and the fan-out area defined by the pixel definition layer at least partially overlap. It may be that the light-emitting area corresponding to multiple rows of pixels overlaps the fan-out area, or the light-emitting area corresponding to only one row of the pixels overlaps the fan-out area. The light-emitting area corresponding to at least one row of the pixels is at least partially located in the fan-out area. The row of pixels is a row of pixels near the bottom border of the display panel, which is the last row of pixels. The light-emitting area corresponding to the last row of pixels may be partially located within the fan-out area or entirely located within the fan-out area.

In one embodiment, as shown in FIG. 2, the light-emitting area corresponding to the last row of pixels is partially located in the fan-out area 102. The corresponding last row of the pixel electrodes 151 comprises a first portion and a second portion. The first portion is located within the fan-out area 102 and the second portion is located within the display area that does not overlap with the fan-out area. At this time, the area of the overlapping portion of the display area 101 and the fan-out area 102 is the sum of the area occupied by the light-emitting area partially in the fan-out area 102 and the display area right of the fan-out area 102. Compared with the prior art, the embodiment of the present disclosure increases the area of the display area, and the increased area is as shown in the area of the overlapping portion of the display area and the fan-out area, thereby reducing the area of the non-display area. The reduced area is shown in the area of the overlapping portion of the display area and the fan-out area. The problem that the non-display area of the display panel is too large is alleviated and the narrow border and full-screen technology are further implemented.

In another embodiment, as shown in FIG. 3, the light-emitting area corresponding to the last row of pixels is entirely located within the fan-out area 102. The corresponding last row of the pixel electrodes 151 comprises a first portion and a second portion. The first portion is located within the fan-out area 102 and the second portion is located within the display area that does not overlap with the fan-out area. Compared with the prior art, the embodiment of the present disclosure increases the area of the display area, and the increased area is as shown in the area of the overlapping portion of the display area and the fan-out area, thereby reducing the area of the non-display area. The reduced area is shown in the area of the overlapping portion of the display area and the fan-out area. The problem that the non-display area of the display panel is too large is alleviated and the narrow border and full-screen technology are further implemented. Compared with the embodiment (a) shown in FIG. 2, this embodiment further increases the area of the overlapping portion of the display area and the fan-out area. That is, the display area of the display panel is further increased to reduce the area of the non-display area, and thus the narrow border and full-screen technology are further implemented.

In another embodiment, as shown in FIG. 4 to FIG. 7, another schematic view of an OLED display panel according to the present disclosure is illustrated. In this embodiment, in addition to the structure shown in FIG. 2, the OLED display panel 10 further includes a transition electrode layer. The transition electrode layer is formed on a first planarization layer 140 and patterned to form transition electrodes 170. The transition electrodes 170 comprises a last row of the transition electrodes 171, a second last row of the transition electrodes 172 corresponding to the second last row of the pixels (i.e. the second row of the pixels that is next to the last row of the pixels), and other rows of the transition electrodes 173 corresponding to other rows of the pixels, wherein the second last row of the transition electrodes 172 and other rows of the transition electrodes 173 are located directly above the drain electrode 1362. Additionally, the second last row of the transition electrodes 172, the other rows of the transition electrodes 173 have the size same as the size of the drain electrode 1362. The size of the last row of the transition electrodes 171 is larger than the size of the second last row of the transition electrodes 172. The material of the transition electrodes 170 is the same as the material of the source-drain electrode layer. A second planarization layer 180 covers the transition electrode layer and the first planarization layer 140. The second planarization layer 180 uses the same material and has the same function as that of the first planarization layer 140. The transition electrodes connect the pixel electrodes and the drain electrode corresponding thereto. In this embodiment, the pixel electrodes 150 comprises the last row of the pixel electrodes 151 corresponding to the last row of the pixels, the pixel electrodes 151 corresponding to the second last row of the pixels, and the pixel electrodes 153 corresponding to the other rows of the pixels.

In one embodiment, the light-emitting area and the fan-out area defined by the pixel definition layer at least partially overlap. It may be that the light-emitting area corresponding to multiple rows of pixels overlaps the fan-out area, or the light-emitting area corresponding to only one row of the pixels overlaps the fan-out area. The light-emitting area corresponding to at least one row of the pixels is at least partially located in the fan-out area. The row of the pixels is a row of pixels near the bottom border of the display panel, which is the last row of pixels. The light-emitting area corresponding to the last row of pixels may be partially located within the fan-out area or entirely located within the fan-out area.

Figure 4:
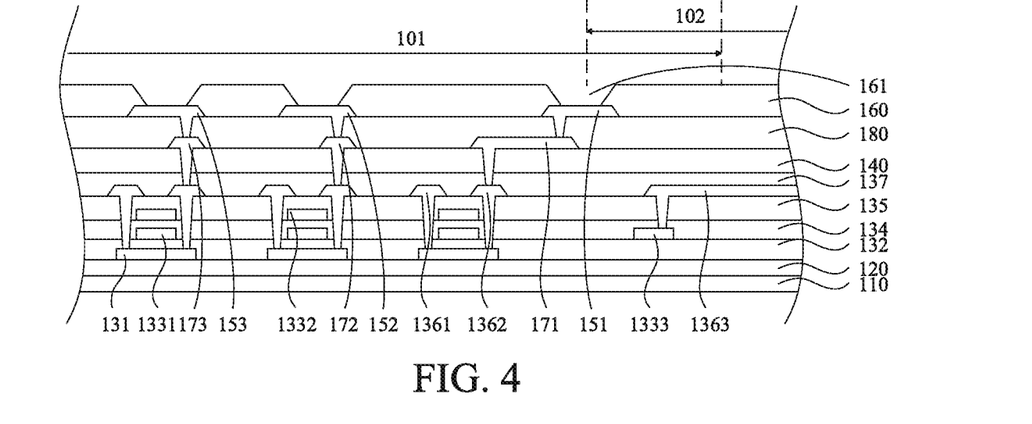
FIG. 4 is a schematic view showing a third structure of a display panel according to the embodiment of the present disclosure.

In one embodiment, as shown in FIG. 4, the light-emitting area corresponding to the last row of the pixels is partially located within the fan-out area 102. The corresponding last row of the pixel electrodes 151 is also partially located within the fan-out area 102. The corresponding last row of the transition electrodes 171 is located within the display area 101. In this embodiment, the last row of the transition electrodes 171 may also partially extend to the fan-out area 102, but it is not limited thereto. Similar to the embodiment (a) shown in FIG. 2, the area of the overlapping portion of the display area 101 and the fan-out area 102 is the sum of the area occupied by the light-emitting area partially in the fan-out area 102 and the display area right of the fan-out area 102. Compared with the prior art, the embodiment of the present disclosure increases the area of the display area, and the increased area is as shown in the area of the overlapping portion of the display area and the fan-out area, thereby reducing the area of the non-display area. The reduced area is shown in the area of the overlapping portion of the display area and the fan-out area. The problem that the non-display area of the display panel is too large is alleviated and the narrow border and full-screen technology are further implemented. This embodiment adds the transition electrodes without changing the size of the arrangement of the pixel electrodes, and moving the last row of the pixels partially to the fan-out area through the transition electrodes, thereby increasing the area of the display area and reducing the area of the non-display display area.

Figure 5:
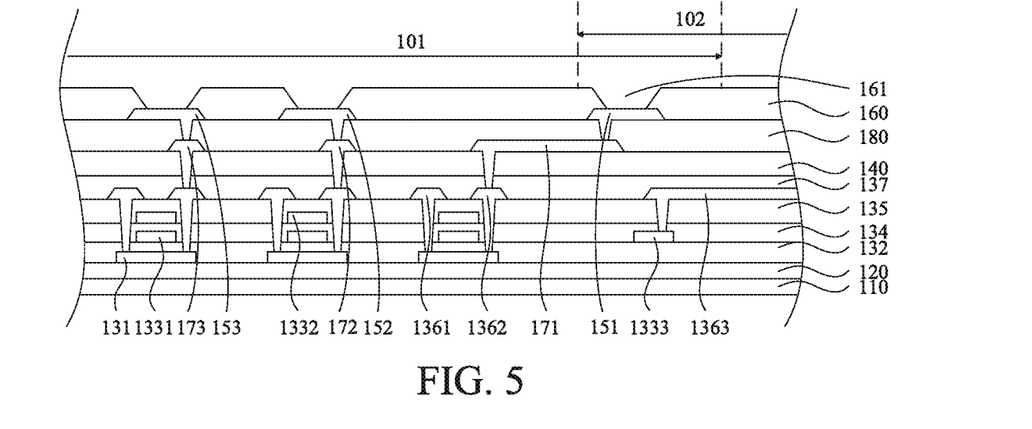
FIG. 5 is a schematic view showing a fourth structure of a display panel according to the embodiment of the present disclosure.

In another embodiment, as shown in FIG. 5, the light-emitting area corresponding to the last row of pixels is all located within the fan-out area 102. The corresponding last row of the pixel electrodes 151 is also entirely located within the fan-out area 102. The corresponding last row of the transition electrodes 171 comprises a first portion and a second portion. The first portion is located within the fan-out area 102 and the second portion is located within the display area that does not overlap the fan-out area. Compared with the prior art, the embodiment of the present disclosure increases the area of the display area, and the increased area is as shown in the area of the overlapping portion of the display area and the fan-out area, thereby reducing the area of the non-display area. The reduced area is shown in the area of the overlapping portion of the display area and the fan-out area. The problem that the non-display area of the display panel has too large area is alleviated and the narrow border and full-screen technology are further implemented. Compared with the embodiment (a) shown in FIG. 3, this embodiment further increases the area of the overlapping portion of the display area and the fan-out area. That is, the display area of the display panel is further increased to reduce the area of the non-display area, and thus the narrow border and full-screen technology are further implemented.

Figure 6:
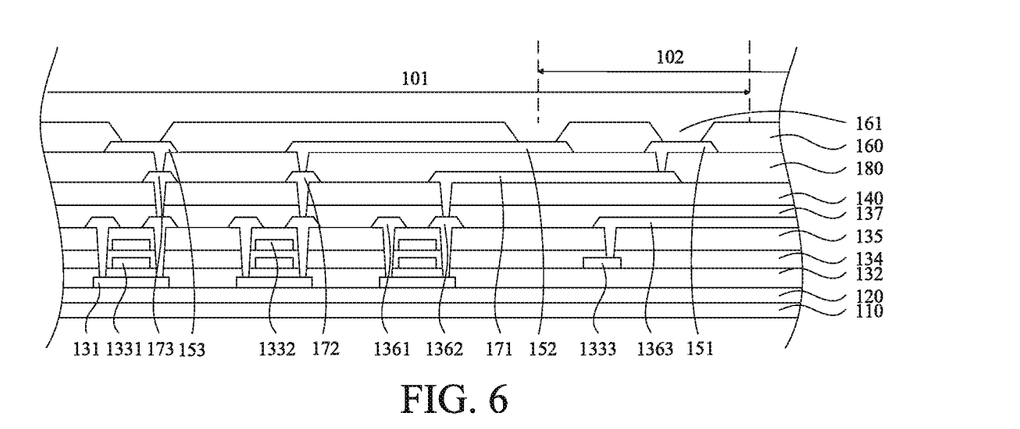
FIG. 6 is a schematic view showing a fifth structure of a display panel according to the embodiment of the present disclosure.

In yet another embodiment, as shown in FIG. 6, the light-emitting area corresponding to the last row of pixels is all located within the fan-out area 102. The corresponding last row of the pixel electrodes 151 is also entirely located within the fan-out area 102. The corresponding last row of the transition electrodes comprises a first portion and a second portion. The first portion is located within the fan-out area 102 and the second portion is located within the display area that does not overlap the fan-out area. The light-emitting area corresponding to the second last row of the pixels is partially located within the fan-out area 102. The corresponding second last row of pixel electrodes 152 comprises a first portion and a second portion. The first portion is located within the fan-out area 102, and the second portion is located within the display area that does not overlap the fan-out area. The corresponding second last row of transition electrodes 172 is located within the display area that does not overlap the fan-out area 102. Compared with the prior art, the embodiment of the present disclosure increases the area of the display area, and the increased area is as shown in the area of the overlapping portion of the display area and the fan-out area, thereby reducing the area of the non-display area. The reduced area is shown in the area of the overlapping portion of the display area and the fan-out area. The problem that the non-display area of the display pane is too large is alleviated and the narrow border and full-screen technology are further implemented. Compared with the embodiment (b) shown in FIG. 3, this embodiment extends the last row of the pixel electrodes for arranging all of the light-emitting area corresponding to the last row of the pixels in the fan-out area, and extends the second last row of the transition electrodes for arranging a part of the light-emitting area corresponding to the second last row of the pixels in the fan-out area, so as to further increase the area of the overlapping portion of the display area and the fan-out area. That is, the display area of the display panel is further increased to reduce the area of the non-display area, and thus the narrow border and full-screen technology are further implemented.

Figure 7:
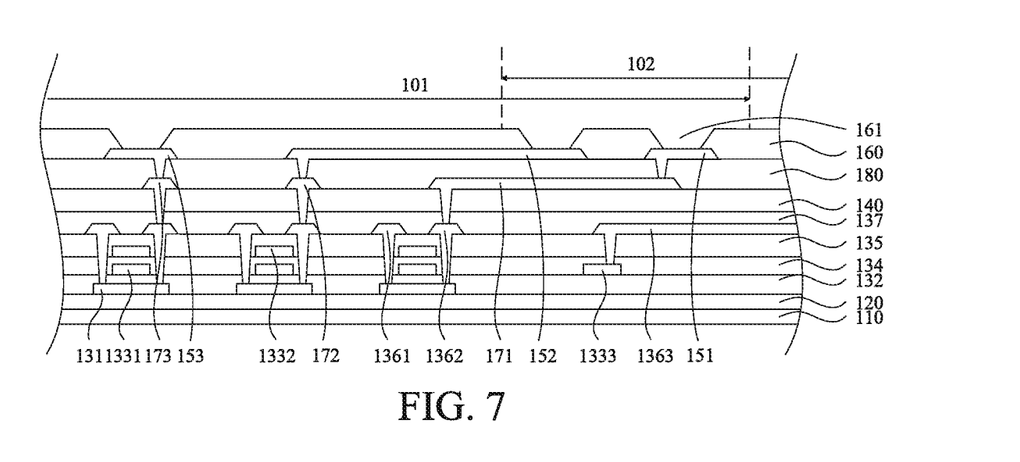
FIG. 7 is a schematic view showing a sixth structure of a display panel according to the embodiment of the present disclosure.

In a further embodiment, as shown in FIG. 7, the light-emitting area corresponding to the last row of pixels is all located within the fan-out area 102. The corresponding last row of the pixel electrodes 151 is also entirely located within the fan-out area 102. The corresponding last row of the transition electrodes 171 comprises a first portion and a second portion. The first portion is located within the fan-out area 102 and the second portion is located within the display area that does not overlap the fan-out area. The light-emitting area corresponding to the second last row of the pixels is entirely located within the fan-out area 102. The corresponding second last row of pixel electrodes 152 comprises a first portion and a second portion. The first portion is located within the fan-out area 102, and the second portion is located within the display area that does not overlap the fan-out area. The corresponding second last row of the transition electrodes 172 is located within the display area that does not overlap the fan-out area 102. Compared with the prior art, the embodiment of the present disclosure increases the area of the display area, the increased area is as shown in the area of the overlapping portion of the display area and the fan-out area, thereby reducing the area of the non-display area. The reduced area is shown in the area of the overlapping portion of the display area and the fan-out area. The problem that the non-display area of the display panel has too large area is alleviated and the narrow border and full-screen technology are further implemented. Compared with the embodiment (c) shown in FIG. 3, this embodiment extends the second last row of the transition electrodes for arranging all of the light-emitting area corresponding to the second last row of the pixels in the fan-out area so as to further increases the area of the overlapping portion of the display area and the fan-out area. That is, the display area of the display panel is further increased to reduce the area of the non-display area again, and thus the narrow border and full-screen technology are further implemented.

Furthermore, one embodiment of the present disclosure provides a display device comprising the display panel of any of abovementioned embodiments. The display panel includes a display area and a fan-out area, wherein the fan-out area and the display area at least partially overlap.

This embodiment provides a display device comprising a display panel. The display area of the display panel expends to the fan-out area by arranging at least one part of the fan-out area in the display area, and therefore the area of the display area of the display panel is increased to reduce the area of the non-display area that is occupied by the fan-out area. That is, the problem that the non-display area of the display panel has too large area is alleviated and the narrow border and full-screen technology are further implemented.

In one embodiment, the display panel further includes a driving circuit disposed within the display area that does not overlap the fan-out area.

In one embodiment, the display panel includes a pixel definition layer defining a light-emitting area which at least partially overlaps the fan-out area.

In one embodiment, the light-emitting area corresponding to at least one row of pixels is at least partially located within the fan-out area.

In one embodiment, the light-emitting area corresponding to the last row of pixels is at least partially located within the fan-out area.

In one embodiment, the light-emitting area corresponding to the last row of pixels is located within the fan-out area.

In one embodiment, the display panel further comprises a plurality of pixel electrodes which are at least partially located within the fan-out area.

In one embodiment, the pixel electrodes corresponding to at least one row of pixels are at least partially located within the fan-out area.

In one embodiment, the pixel electrodes corresponding to the last row of pixels are located within the fan-out area.

In one embodiment, the pixel electrodes corresponding to the last row of pixels comprise a first portion and a second portion, wherein the first portion is located within the fan-out area, and the second portion is located within the display area that does not overlap the fan-out area.

In one embodiment, the pixel electrodes corresponding to the last row of the pixels are located within the fan-out area.

In one embodiment, the display panel further comprises a plurality of transition electrodes, and the last row of the transition electrodes connect with the last row of the pixel electrodes and a drain electrode corresponding to the last row of the pixels.

In one embodiment, the size of each of the last row of the transition electrodes is larger than the size of the drain electrode connecting thereto.

In one embodiment, the display panel is provided with other transition electrodes connecting to the pixel electrodes and the drain electrode corresponding to the other transition electrodes, respectively.

In one embodiment, the area of each of the last row of the transition electrodes is larger than the area of each of the other transition electrodes.

In one embodiment, the size of each of the other transition electrodes is equal to the size of the drain electrode connecting thereto.

In one embodiment, each of the other transition electrodes is located directly above the drain electrode connecting thereto.

In one embodiment, a material of the transition electrodes is the same as a material of the drain electrode.

In one embodiment, the display panel comprises conversion vias and conversion lines both located within the fan-out area, wherein the conversion lines and the drain electrode within the driving circuit are disposed on the same layer, and a part of the conversion lines connect to a gate driving circuit through the conversion vias.

It is understood according to abovementioned embodiments:

The present disclosure provides a display panel and a display device. The display panel has a display area and a fan-out area. The fan-out area and the display area at least partially overlap. By moving partial light-emitting area of at least one part of pixels to a location above the fan-out area circuit, and arranging at least one part of the fan-out area in the display area, the display area of the display panel expends to the fan-out area and therefore the area of the display area of the display panel is increased to reduce the area of the non-display area that is occupied by the fan-out area. That is, the problem that the non-display area of the display panel has too large area is alleviated and the narrow border and full-screen technology are further implemented.

In summary, although the present invention has been described with preferred embodiments thereof, the present invention is not limited thereto. It is understood that many changes and modifications to the described embodiments can be carried out by the skilled person in the art without departing from the scope and the spirit of the invention that is intended to be limited only by the appended claims.

What is claimed is:

1. A display panel, comprising:
a display area;
a fan-out area; and
a plurality of pixel electrodes;
wherein the fan-out area and the display area at least partially overlap, at least one row of the pixel electrodes is entirely located within the display area, at least one row of the pixel electrodes is partially located within the display area and partially located within the fan-out area, and at least one row of the pixel electrodes is entirely located within the fan-out area, wherein a size of the pixel electrodes partially located within the display area and partially located within the fan-out area is larger than a size of the pixel electrodes entirely located within the display area and larger than a size of the pixel electrodes entirely located within the fan-out area.

2. The display panel according to claim 1, wherein the display panel further includes a driving circuit disposed within the display area that does not overlap the fan-out area.

3. The display panel according to claim 2, wherein the display panel includes a pixel definition layer defining a light-emitting area which at least partially overlaps the fan-out area.

4. The display panel according to claim 3, wherein the light-emitting area corresponding to at least one row of pixels is at least partially located within the fan-out area.

5. The display panel according to claim 4, wherein the light-emitting area corresponding to a last row of pixels is at least partially located within the fan-out area.

6. The display panel according to claim 5, wherein the light-emitting area corresponding to the last row of pixels is located within the fan-out area.

7. The display panel according to claim 3, wherein the pixel electrodes corresponding to at least one row of pixels are at least partially located within the fan-out area.

8. The display panel according to claim 7, wherein the pixel electrodes corresponding to a last row of pixels are at least partially located within the fan-out area.

9. The display panel according to claim 8, wherein the pixel electrodes corresponding to the last row of the pixels are located within the fan-out area.

10. The display panel according to claim 9, wherein the display panel further comprises a plurality of transition electrodes, and the last row of the transition electrodes connect with the last row of the pixel electrodes and a drain electrode corresponding to the last row of the pixels.

11. The display panel according to claim 10, wherein the size of each of the last row of the transition electrodes is larger than the size of the drain electrode connecting thereto.

12. The display panel according to claim 10, wherein the display panel is provided with other transition electrodes connecting to the pixel electrodes and the drain electrode corresponding to the other transition electrodes, respectively.

13. The display panel according to claim 12, wherein the area of each of the last row of the transition electrodes is larger than the area of each of the other transition electrodes.

14. The display panel according to claim 12, wherein the size of each of the other transition electrodes is equal to the size of the drain electrode connecting thereto.

15. The display panel according to claim 12, wherein each of the other transition electrodes is located directly above the drain electrode connecting thereto.

16. The display panel according to claim 10, wherein a material of the transition electrodes is the same as a material of the drain electrode.

17. The display panel according to claim 2, wherein the display panel comprises conversion vias and conversion lines both located within the fan-out area, wherein the conversion lines and the drain electrode within the driving circuit are disposed on the same layer, and a part of the conversion lines connect to a gate driving circuit through the conversion vias.

18. A display device, comprising a display panel, wherein the display panel comprises a display area, a fan-out area, and a plurality of pixel electrodes, wherein the fan-out area and the display area at least partially overlap, at least one row of the pixel electrodes is entirely located within the display area, at least one row of the pixel electrodes is partially located within the display area and partially located within the fan-out area, and at least one row of the pixel electrodes is entirely located within the fan-out area, wherein a size of the pixel electrodes partially located within the display area and partially located within the fan-out area is larger than a size of the pixel electrodes entirely located within the display area and larger than a size of the pixel electrodes entirely located within the fan-out area.

* * * * *